(12) United States Patent
Singh et al.

(10) Patent No.: US 8,503,210 B2
(45) Date of Patent: Aug. 6, 2013

(54) CONDITIONALLY PRECHARGED DYNAMIC CONTENT ADDRESSABLE MEMORY

(75) Inventors: Mandeep Singh, Austin, TX (US); David Hugh McIntyre, Sunnyvale, CA (US); Hung Phuong Ngo, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 302 days.

(21) Appl. No.: 12/975,601

(22) Filed: Dec. 22, 2010

(65) Prior Publication Data

US 2012/0163059 A1 Jun. 28, 2012

(51) Int. Cl.
*G11C 15/04* (2006.01)
*G11C 15/00* (2006.01)

(52) U.S. Cl.
USPC ........ 365/49.17; 365/49.1; 365/203; 711/108

(58) Field of Classification Search
USPC ....................... 365/49.1, 203, 49.17; 711/108
See application file for complete search history.

(56) References Cited

U.S. PATENT DOCUMENTS

| | | | | |
|---|---|---|---|---|
| 5,617,348 | A * | 4/1997 | Maguire | 365/49.17 |
| 5,936,873 | A * | 8/1999 | Kongetira | 365/203 |
| 6,166,939 | A * | 12/2000 | Nataraj et al. | 365/49.15 |
| 6,262,929 | B1 * | 7/2001 | Miyatake et al. | 365/203 |
| 6,804,133 | B1 | 10/2004 | Khanna | |
| 2004/0098559 | A1 * | 5/2004 | Masui | 711/202 |
| 2008/0259667 | A1 | 10/2008 | Wickeraad | |

FOREIGN PATENT DOCUMENTS

EP 905709 A2 3/1999

* cited by examiner

*Primary Examiner* — J. H. Hur
(74) *Attorney, Agent, or Firm* — Volpe and Koenig, P.C.

(57) ABSTRACT

A conditionally precharged content addressable memory (CAM) includes forcing a mismatch on a matchline of the CAM if a data entry in the CAM is invalid. The matchline of the CAM is precharged only if the data entry is valid.

8 Claims, 3 Drawing Sheets

CONDITIONALLY PRECHARGED DYNAMIC CONTENT ADDRESSABLE MEMORY

FIELD OF INVENTION

This application is related to content addressable memories.

BACKGROUND

A content addressable memory (CAM) is often utilized where very high speed searching applications are required. A CAM operates by comparing a stored value to a searchline value, where a match occurs if the stored value and searchline value are the same. In this case, a CAM matchline is pulled high to rail voltage indicating a match. If the searchline value and stored value are different, the CAM matchline is pulled low, indicating a mismatch.

In a dynamic mismatch CAM, however, a significant amount of energy is consumed to drive the matchlines of the CAM, especially if all of the matchlines in the CAM are pulled high to the rail voltage by precharging before the comparison, or evaluation, phase. Accordingly, techniques have been implemented in order to attempt to reduce the power consumed by the matchlines. For example, in a technique referred to as "low swing matchline sensing", the matchline is not pulled all the way to the rail voltage, but to some voltage between the reference voltage and the rail voltage. In another technique, a comparison is only performed on one or a few bits of a search word, with the rest of the bits only being compared if the first one or few bits match.

However, the techniques described above sacrifice performance, or add complexity, in order to save power and therefore may not be viable for use in a high performance design.

SUMMARY OF EMBODIMENTS

A method of conditionally precharging a CAM is disclosed. The method includes forcing a mismatch on a matchline of the CAM if a data entry in the CAM is invalid, and the matchline is precharged only if the data entry is valid.

A CAM is disclosed, that includes an evaluate component including a first input, a second input, and an output; a precharge component including a first input, a second input, and an output; a first transistor coupled to the evaluate component, a matchline of the CAM and a reference voltage, and a second transistor coupled to the precharge component, the matchline of the CAM and a rail voltage. When the first and second inputs of the evaluate component are both in a first state, the output of the evaluate component is in a second state and the first transistor is not activated. When the first input of the evaluate component is in a second state, the output of the evaluate component is in a first state and the first transistor is activated to connect the matchline to the reference voltage. When the first and second inputs of the precharge component are in a first state, the output of the precharge component is in a second state and the second transistor is activated to connect the matchline to the rail voltage, and when the first input of the precharge component is in a second state, the output of the precharge component is in a first state and the second transistor is not activated.

A semiconductor device is disclosed. The semiconductor device includes a content addressable memory (CAM) configured to conditionally precharge a matchline associated with a data entry of the CAM responsive to a validity of the data entry.

A computer readable medium storing instruction representing a hardware design of a semiconductor device is disclosed. The semiconductor device includes a content addressable memory (CAM) configured to conditionally precharge a matchline associated with a data entry of the CAM responsive to a validity of the data entry.

DETAILED DESCRIPTION OF THE EMBODIMENTS

In order to achieve high performance and high speed searching of a CAM while controlling power consumption by the CAM, a technique may be utilized that takes advantage of the fact that not all data entries are valid in a memory array at all times. Accordingly, a CAM design may enable or disable matches on a per-entry basis depending on the validity of the entry by pulling the matchline of the CAM low when an entry is invalid to force a mismatch. In addition, power savings may be realized by only precharging the matchline during the precharge phase of operation when the data is valid.

Figure 1:
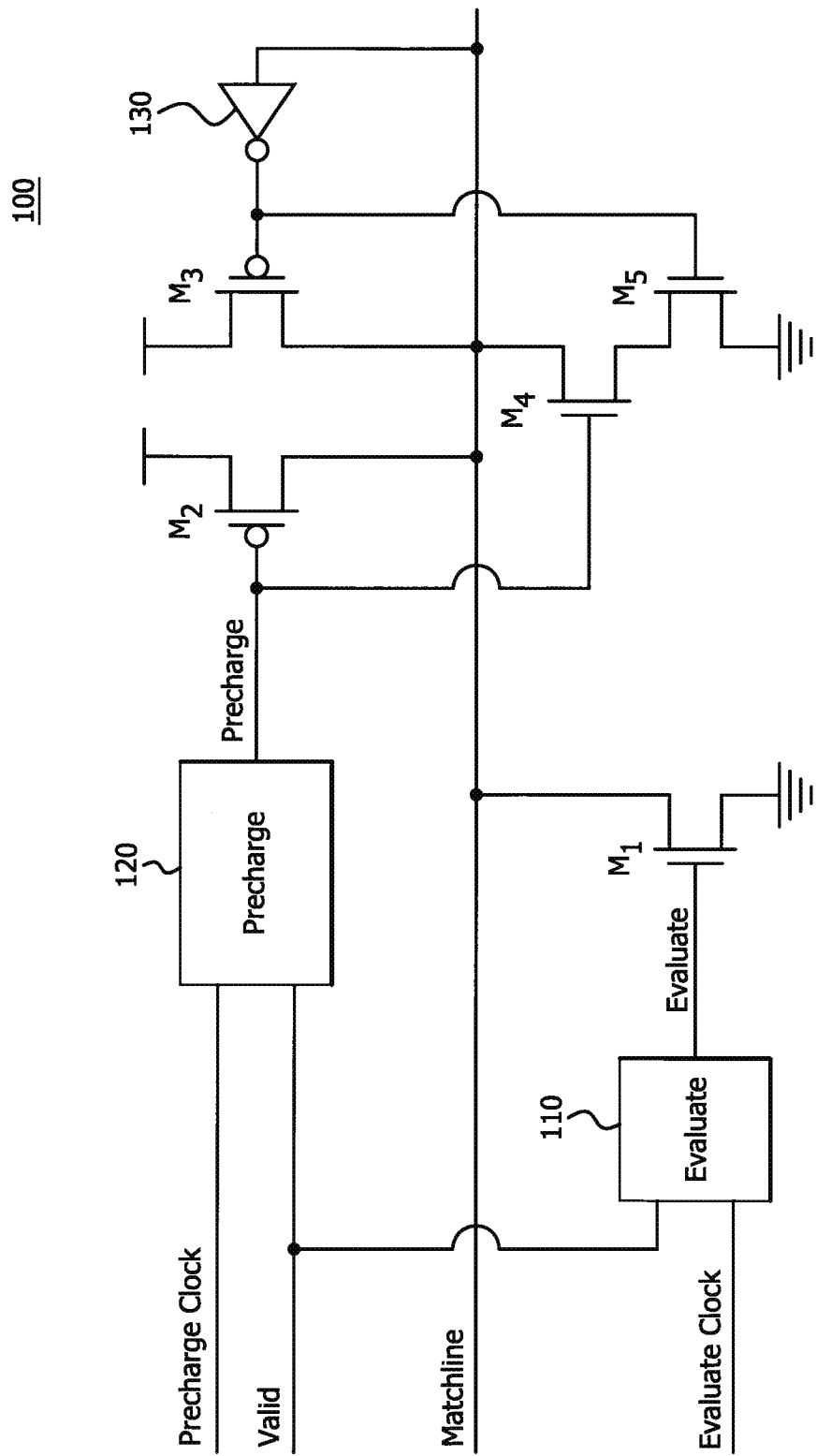
FIG. 1 is an example conditionally precharged dynamic CAM device.

FIG. 1 is an example conditionally precharged dynamic CAM device 100. The CAM 100 includes a plurality of transistors, designated $M_1$, $M_2$, $M_3$, $M_4$, and $M_5$ an evaluate component 110, a precharge component 120, and an inverter 130. The evaluate component 110 and precharge component 120 may be in the form of circuitry to perform evaluation and precharging functions, respectively, for the CAM device 100. In the example CAM device 100, transistors $M_1$, $M_4$ and $M_5$ are P-metal oxide semiconductor (PMOS) transistors and transistors $M_2$ and $M_3$ are NMOS transistors.

The sources of transistors $M_2$ and $M_3$ are connected to the rail voltage and their drains are connected to the matchline of the CAM device 100. In addition, the drain of transistor $M_3$ is connected to the drain of transistor $M_4$. The evaluate component 110 includes as inputs a valid signal line and the evaluate clock line, while the output evaluate signal of the evaluate component 110 is connected to the gate of transistor $M_1$. The drain of transistor $M_1$ is connected to the matchline and the source is connected to reference voltage. The precharge component 120 has as inputs the valid signal line and precharge clock line. The precharge component 120 outputs a precharge signal line, which is connected to the gates of transistors $M_2$ and $M_4$. The input of inverter 130 is connected to the matchline and the output is connected to the gates of transistors $M_3$ and $M_5$. Additionally, the source of transistor $M_4$ is connected to the drain of transistor $M_5$, whose source is connected to the reference voltage.

Additional nominal components that may be present in a CAM device, such as CAM device 100, but are not shown in FIG. 1 may also be included. For example, circuitry that is configured to pull the matchline low when the data is valid, but a mismatch occurs between the searchline bit and the stored bit in the CAM device 100 may be present although not shown.

Although the operation of the components of the CAM device 100 during the evaluate and precharge phase will be described in more detail below, generally, the evaluate component 110 and transistor $M_1$ operate to pull the matchline down to the reference voltage during the evaluation phase when a data entry is not valid, thereby forcing a mismatch. The precharge component 120 and the transistor $M_2$ operate during the precharge phase to precharge the matchline only when the data entry in the CAM device 100 is valid. Transistor $M_3$ and inverter 130 operate as what may be referred to as a "half-keeper circuit" that keeps the matchline high when active. Furthermore, transistors $M_3$, $M_4$ and $M_5$, along with the inverter 130 may be referred to as a "full-keeper" circuit, where transistor $M_5$ keeps the matchline pulled low. Transistor $M_4$ is utilized to prevent transistors $M_4$ and $M_5$ from opposing one another, which operation will be described in more detail below.

It should be noted, however, that the CAM device 100 may be implemented without the utilization of keeper circuit or may be implemented with only a half-keeper circuit, (e.g., transistor $M_3$ and inverter 130). For example, where the matchline is pulled low every evaluation phase, it may not float long enough to accumulate enough charge to require a keeper circuit.

Figure 2:
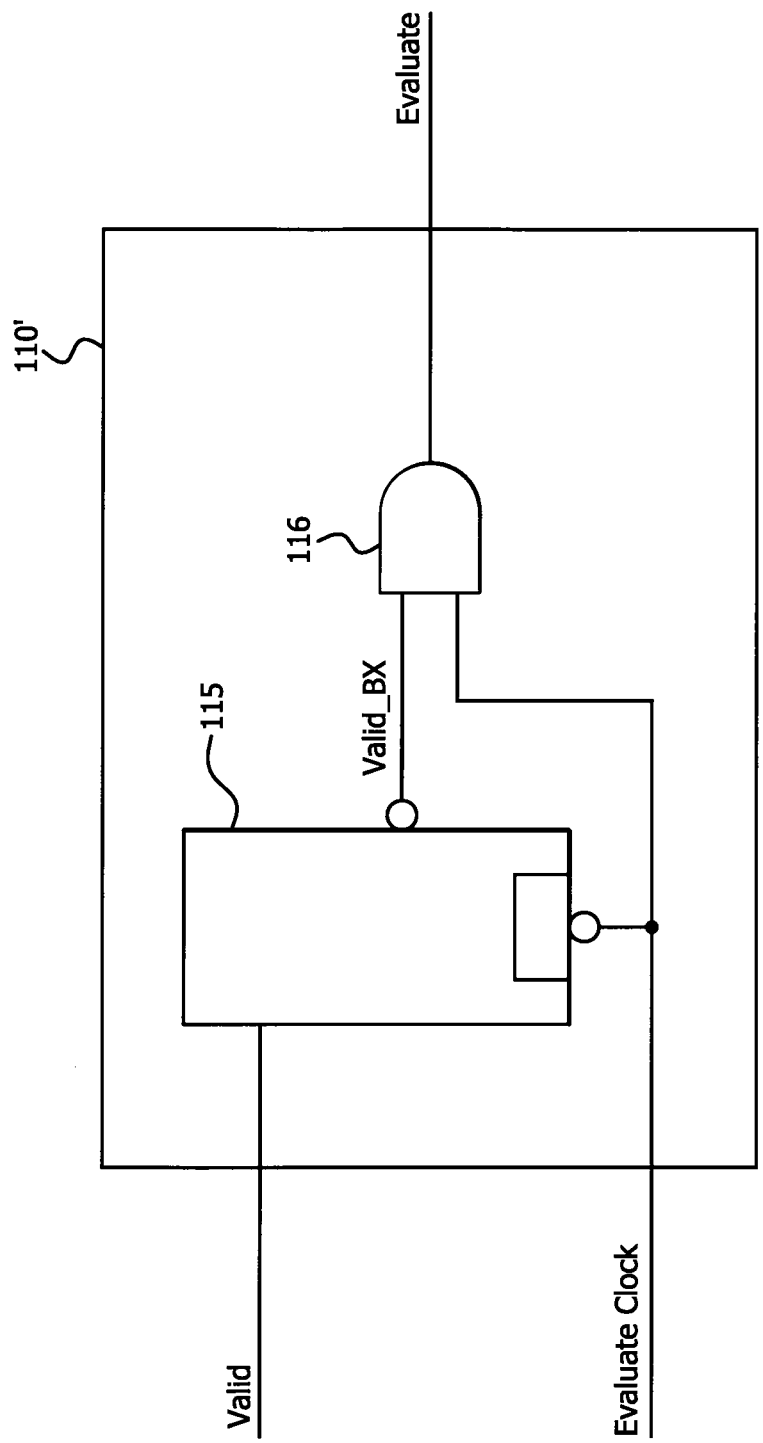
FIG. 2 is an example evaluate component circuit.

FIG. 2 is an example evaluate component circuit 110'. The example evaluate component circuit 110' includes a B-latch, or B-phase latch, 115 and an AND gate 116. The B-latch 115 includes as inputs the valid signal line and evaluate clock line and outputs a valid_bx line as one input into the AND gate 116, whose other input is the evaluate clock line. The AND gate 116 outputs the evaluate signal line which is connected to the gate of the transistor $M_1$ of FIG. 1. Accordingly, the B-latch 115 is transparent when the evaluate clock line signal is low, and holds its state when the evaluate clock line signal is high.

Figure 3:
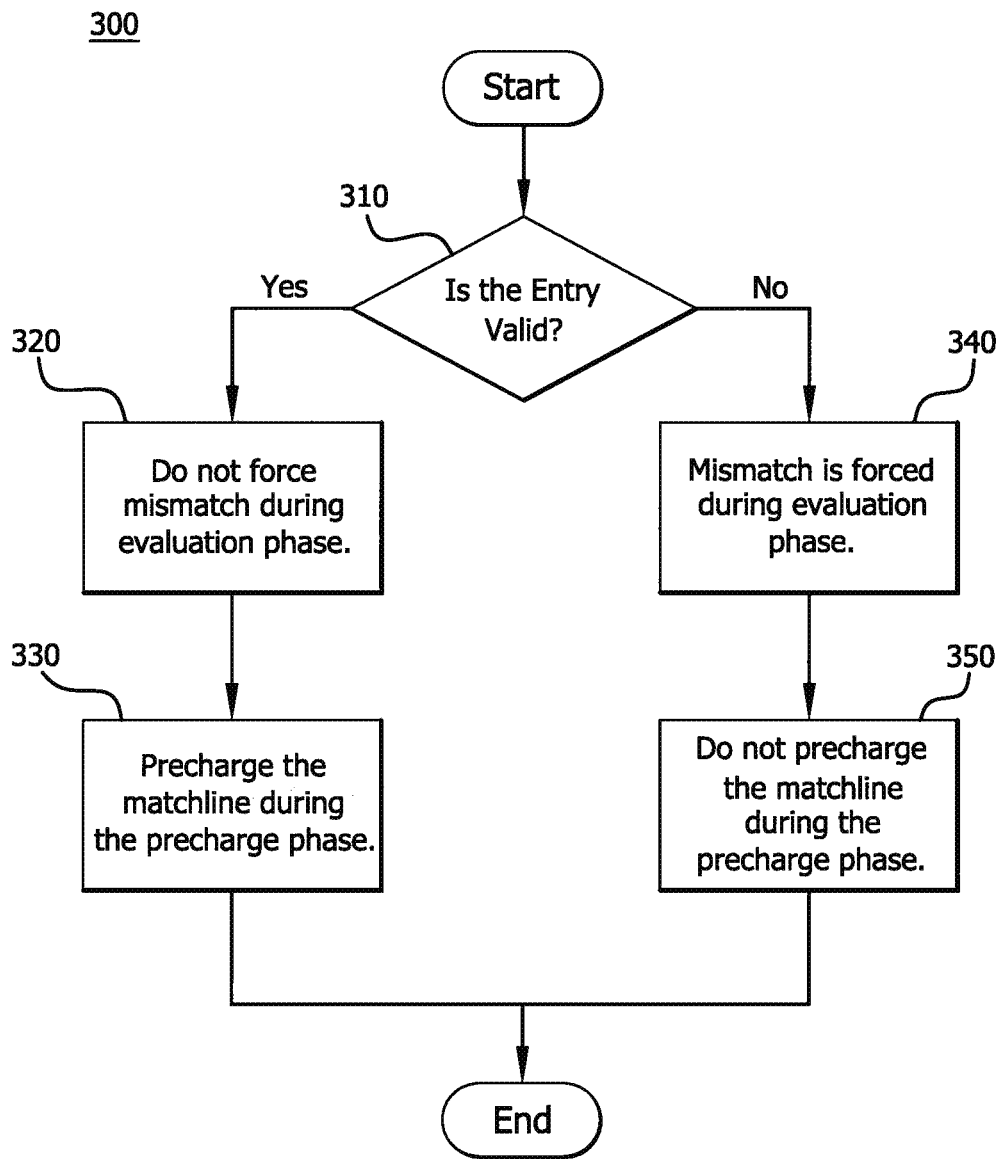
FIG. 3 is a flow diagram of an example method of performing evaluation and precharging in a conditionally precharged dynamic CAM.

The CAM device 100 of FIG. 1 may be utilized to take advantage of the fact that data entries are not all valid in the CAM device 100 at all times. Accordingly, power consumption may be reduced. FIG. 3 is a flow diagram of an example method 300 of performing evaluation and precharging in a conditionally precharged dynamic CAM, such as the CAM device 100.

Reference is now made to the CAM device 100 and to the method 300 of FIG. 3 in describing the method of performing evaluation and precharging in a conditionally precharged dynamic CAM. In step 310, a determination is made as to whether or not an entry is valid. For example, when a data entry is written into the memory array, a per-entry valid bit may be set to a first, or "high" state, indicating that a valid entry exists. Alternatively, if the entry is not valid, then the valid bit may be set to a second, or "low" state, to indicate no valid entry exists. Accordingly, the valid signal line is set high or low depending on whether an entry is valid.

During the evaluation phase, the evaluate component 110 of the CAM device 100 receives as inputs the valid signal along with the evaluate clock signal set to a high state. If the entry is valid (step 310), then a mismatch is not forced during the evaluation phase (step 320). For example, where the evaluate component 110 receives both the valid and evaluate clocks as high state input signals, the output evaluate signal is pulled low, which in turn does not activate transistor $M_1$ and the matchline is not pulled down to the reference voltage. In the example evaluate component 110' of FIG. 2, this may be achieved in that when the B-latch 115 receives both a high valid signal line and evaluate clock line, the valid_bx line output is low, which when input into AND gate 116 results in the evaluate signal line being in the low state.

During the precharge phase when the entry is determined to be valid, the matchline is precharged (step 330). Accordingly, when both the valid line and the precharge clock line are high as inputs into the precharge component 120, the precharge line output from the precharge component 120 is low, activating transistor $M_2$ to pull the matchline high to the rail voltage. Transistor $M_4$ aids in the precharge process by turning off to disable the keeper pulldown path through transistor $M_5$, preventing opposition to, or a drive fight with, transistor $M_2$ precharging the matchline. It should be noted that if transistor $M_2$ is strong enough to overcome transistor $M_5$, transistor $M_4$ may not be needed.

In this state, since the matchline will be pulled high, inverter 130 will output a low signal, switching on transistor $M_3$, which will maintain, or keep, the matchline in the high state. Transistors $M_4$ and $M_5$ will not be activated as their respective gates will be at a low level.

If the entry is not determined to be valid in step 310, then a mismatch is forced during the evaluation phase (step 340). In this example, where the evaluate component 110 receives the valid signal as a low state input signal and the evaluate clock as a high state input signal, the output evaluate signal is pulled high, which in turn activates transistor $M_1$ and the matchline is pulled down to the reference voltage, forcing a mismatch. In the example evaluate component 110' of FIG. 2, this may be achieved in that when the B-latch 115 receives a low valid signal line and high evaluate clock line, the valid_bx line output is high, which when input into AND gate 116 results in the evaluate signal line being in the high state due to all AND inputs being high.

During the precharge phase when the entry is determined to be invalid, it is desirable to not precharge the matchline (step 350). Accordingly, when the valid line is low and the precharge clock line is high as inputs into the precharge component 120, the precharge line output from the precharge component 120 is high, and transistor $M_2$ is therefore not activated. Accordingly, the matchline will not be pulled high to the rail voltage when the entry is determined to be invalid.

In this state, since the matchline will be pulled low, inverter 130 will output a high signal, which will cause transistor $M_5$ to be activated. Additionally, since the precharge line output from the precharge component 120 is high into the gate of transistor $M_4$, this transistor will be activated as well. With both transistors $M_4$ and $M_5$ activated, the matchline will be maintained, or kept, low to the reference voltage.

It should be noted that although in the example method 300, the evaluate stage is presented before the precharge stage, the method may also be performed where the precharge stage is performed before the evaluate stage.

Although features and elements are described above in particular combinations, each feature or element can be used alone without the other features and elements or in various combinations with or without other features and elements. The methods or flow charts provided herein may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

For example, in the above description, the precharge component 120 may be implemented by a NAND gate, however, any suitable circuitry may be utilized to perform the functions of the precharge component 120. Additionally, the evaluate component 110 has been described above as including, for example, a B-latch 115 and AND gate 116 for implementation. However, it is noted that the evaluate component 110 may be implemented using other suitable circuitry. In addition, in the example CAM device 100 above, the first state is described as being a high state while the second state is referred to as being a low state. However, it is noted that by utilizing different components, (e.g., transistors), the high states and low states could be reversed in order to activate the respective components. By utilizing an NMOS transistor as $M_1$ and a PMOS transistor as $M_2$, a "low" evaluate signal line would activate transistor $M_1$ whereas a "high" precharge signal line would activate transistor $M_2$. Other components could similarly be modified in the example CAM device 100 accordingly.

The CAM device 100 and method 300 are described using an example implementation where the evaluate phase and precharge phase occur in succession, with the evaluate phase occurring first. Accordingly, the evaluate clock signal is high during the evaluate phase of operation, while the precharge clock is low. During the precharge phase, the precharge clock is high while the evaluate clock is low. Accordingly, the evaluate component is not active during the precharge phase and the precharge component is not active during the evaluate phase. In an example where the precharge phase and evaluate phase are reversed, (i.e., the precharge phase is before the evaluate phase), a flop may be utilized in place of the B-latch 115. For example, the B-latch 115 provides circuit stability during a transition between an entry going from valid to invalid, or vice versa. For example, the B-latch 115 in the CAM device 100 prevents the valid_bx signal from changing while the evaluate clock signal is high, producing a truncated signal out of the AND gate 116. Accordingly, the evaluate component 110 may be designed in any manner that obviates instability in the CAM device 100.

The example CAM device 100 and method 300 described above refer to a dynamic CAM device and may be implemented on either a local CAM matchline or a global CAM matchline. That is, some dynamic mismatch CAMs utilize multiple stages, with the output of one or more local matchline feeding into a global matchline. Accordingly, the components of the CAM device 100 and method 300 may be utilized on only the local matchlines, the global matchline, or both. Additionally, the example CAM device 100 and method 300 may be utilized in a static CAM.

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions (such instructions capable of being stored on a computer readable media). The results of such processing may be maskworks that are then used in a semiconductor manufacturing process to manufacture a processor which implements aspects of the present invention.

What is claimed is:

1. A content addressable memory (CAM), comprising:
   a precharge component including a first input, a second input, and an output; and
   a first transistor coupled to the precharge component, a matchline of the CAM and a rail voltage;
   wherein when the first and second inputs of the precharge component are in a first state, the output of the precharge component is in a second state and the first transistor is activated to connect the matchline to the rail voltage, and when the first input of the precharge component is in the second state, the output of the precharge component is in the first state and the first transistor is not activated;
   an evaluate component including a first input, a second input, and an output; and
   a second transistor coupled to the evaluate component, the matchline of the CAM and a reference voltage;
   wherein when the first and second inputs of the evaluate component are both in the first state, the output of the evaluate component is in the second state and the second transistor is not activated, and when the first input of the evaluate component is in the second state, the output of the evaluate component is in the first state and the second transistor is activated to connect the matchline to the reference voltage; and
   an inverter having the matchline as an input;
   a third transistor coupled to the rail voltage, the matchline and the output of the inverter;
   a fourth transistor coupled to the output of the precharge component and the matchline; and
   a fifth transistor coupled to the output of the inverter, reference voltage and the fourth transistor;
   wherein when the precharge component output is in the first state, the third transistor is not activated and the fourth and fifth transistor are activated connecting the matchline to the reference voltage, and when the precharge component output is in the second state, the third transistor is activated connecting the matchline to the rail voltage and the third and fourth transistors are not activated.

2. The CAM of claim 1 wherein the first states are high states and the second states are low states.

3. The CAM of claim 1 wherein the first input of the evaluate component and the first input of the precharge component is a valid data entry signal input, the second input of the evaluate component is an evaluate clock signal, and the second input of the precharge component is a precharge clock signal.

4. The CAM of claim 3 wherein when the evaluate clock signal is in a high state, the precharge clock signal is in a low state, and when the precharge clock signal is in a high state, the evaluate clock signal is in a low state.

5. The CAM of claim 1 wherein the second, fourth and fifth transistors are p-type transistors and the first and third transistors are n-type transistors.

6. The CAM of claim 5 wherein:
   the gate of the first transistor is connected to the output of the precharge component, the source of the first transistor is connected to the rail voltage, and the drain of the first transistor is connected to the matchline,
   the gate of the second transistor is connected to the output of the evaluate component, the source of the second transistor is connected to the reference voltage and the drain of the second transistor is connected to the matchline,
   the gate of the third transistor is connected to the output of the inverter, the source of the third transistor is connected to the rail voltage, and the drain of the third transistor is connected to the matchline,
   the gate of the fourth transistor is connected to the output of the precharge component, the drain of the fourth transistor is connected to the drain of the third transistor and the matchline, and the source of the fourth transistor is connected to the drain of the fifth transistor,
   the gate of the fifth transistor is connected to the output of the inverter and the gate of the third transistor, the source of the fifth transistor is connected to the reference voltage, and the drain of the fifth transistor is connected to the source of the fourth transistor.

7. The CAM of claim 1 wherein the evaluate component further comprises:
   a latch device having as inputs the first and second inputs of the evaluate device, and an output; and
   an AND logic gate having as inputs the second input of the evaluate component and the output of the latch device, and where the output of the AND logic gate is the output of the evaluate component;
   wherein when the first and second inputs of the evaluate component are both in the first state, the output of the latch is in a second state and the output of the AND logic gate is in a second state, and when the first input is in a second state, the output of the latch is in a first state, and the output of the AND logic gate is in a first state.

8. The CAM of claim 1 wherein the precharge component further comprises a NAND logic gate having as inputs the inputs of the precharge component and having as an output the output of the precharge component.

* * * * *